US008426721B2

(12) United States Patent
Balbo Di Vinadio et al.

(10) Patent No.: US 8,426,721 B2
(45) Date of Patent: Apr. 23, 2013

(54) VENTILATED PHOTOVOLTAIC RECEIVER

(75) Inventors: Aimone Balbo Di Vinadio, Chiusa San Michele (IT); Mario Palazzetti, Chiusa San Michele (IT)

(73) Assignee: Savio S.p.A., Chiusa San Michele (Torino) (IT)

( * ) Notice: Subject to any disclaimer, the term of this patent is extended or adjusted under 35 U.S.C. 154(b) by 466 days.

(21) Appl. No.: 12/725,135

(22) Filed: Mar. 16, 2010

(65) Prior Publication Data

US 2010/0236605 A1    Sep. 23, 2010

(30) Foreign Application Priority Data

Mar. 20, 2009  (EP) ..................................... 09425112

(51) Int. Cl.
*H01L 31/042*    (2006.01)
(52) U.S. Cl.
USPC ........... 136/246; 136/252; 136/244; 136/251; 136/259; 126/585; 126/600; 126/609; 454/180; 454/181; 454/182; 454/183; 454/185; 250/203.4; 361/700; 361/701; 361/702; 361/703; 361/704
(58) Field of Classification Search .......... 136/240–268; 126/585–684; 454/180–185; 250/203.4; 361/700–705
See application file for complete search history.

(56) References Cited

U.S. PATENT DOCUMENTS

| 4,106,952 A | * | 8/1978 | Kravitz ......................... 136/206 |
| 4,149,903 A | * | 4/1979 | Lindmayer ................... 136/248 |
| 5,498,297 A |   | 3/1996 | O'Neill et al. |
| 6,494,200 B1 | * | 12/2002 | Rylewski ...................... 126/633 |

FOREIGN PATENT DOCUMENTS

| DE | 19914079 A1 * | 9/2000 |
| WO | 2005006435 A1 | 1/2005 |
| WO | 2008013976 A3 | 4/2008 |

OTHER PUBLICATIONS

EP Search Report for Application No. EP 09 42 5112 dated Nov. 12, 2009.

* cited by examiner

*Primary Examiner* — Jeffrey T Barton
*Assistant Examiner* — Chasity N Hurley
(74) *Attorney, Agent, or Firm* — Patterson & Sheridan, L.L.P.

(57) ABSTRACT

A photovoltaic receiver comprising an elongated structure bearing a plurality of photovoltaic cells. Said structure carries a plurality of finned dissipators, mounted on which are said photovoltaic cells, and ventilating means, designed to convey a flow of cooling air towards said dissipators.

9 Claims, 4 Drawing Sheets

VENTILATED PHOTOVOLTAIC RECEIVER

CROSS-REFERENCE TO RELATED APPLICATIONS

This application claims benefit of European patent application serial number 09425112.1, filed Mar. 20, 2009, which is herein incorporated by reference.

BACKGROUND OF THE INVENTION

1. Field of the Invention

The present invention relates in general to photovoltaic systems for the production of electrical energy. More precisely, the invention regards a photovoltaic receiver designed to receive the solar radiation reflected by one or more mirrors.

2. Description of the Related Art

In concentration solar systems a high intensity of the solar radiation is obtained on the photovoltaic elements of the receiver. The high concentration of the solar radiation is advantageous from the standpoint of the yield of the photovoltaic elements, but poses problems caused by the excessive heating of the latter. In fact, above a certain temperature, the efficiency of the photovoltaic elements deteriorates sensibly. It is consequently necessary to envisage a cooling system that will enable the photovoltaic elements to operate in the temperature range that corresponds to high efficiency. On the other hand, it is necessary for the cooling system to be efficient and present a low energy consumption.

SUMMARY OF THE INVENTION

The object of the present invention is to provide a receiver for a concentration photovoltaic system equipped with a cooling system that is simple and inexpensive and presents a low energy consumption.

According to the present invention, the above object is achieved by a photovoltaic receiver having the characteristics forming the subject of claim 1.

BRIEF DESCRIPTION OF THE DRAWINGS

The present invention will now be described in detail with reference to the attached drawings, which are provided purely by way of non-limiting example, wherein.

DETAILED DESCRIPTION

Figure 1:
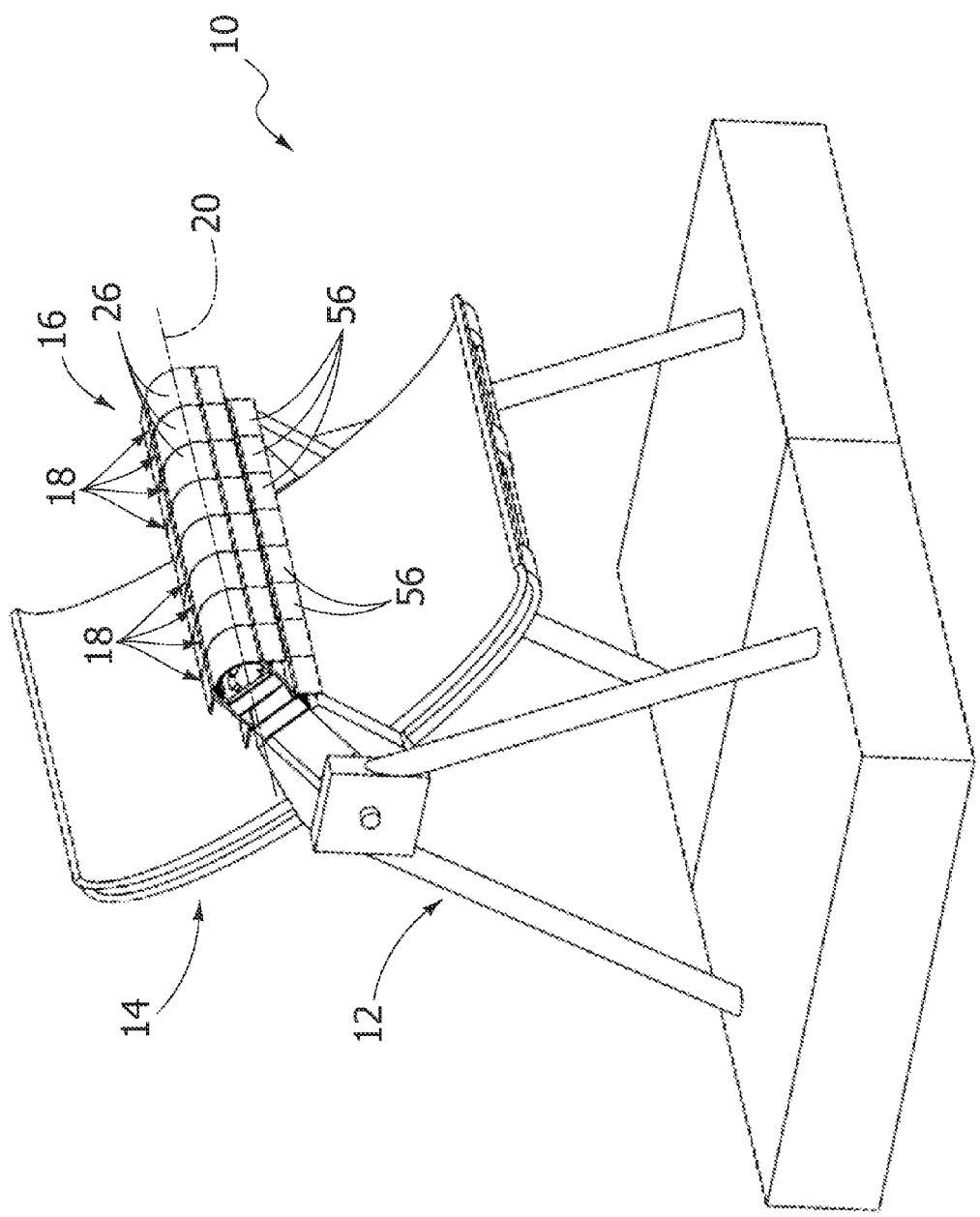
FIG. 1 is a perspective view of a concentration photovoltaic system that uses a receiver according to the present invention.
Figure 2:
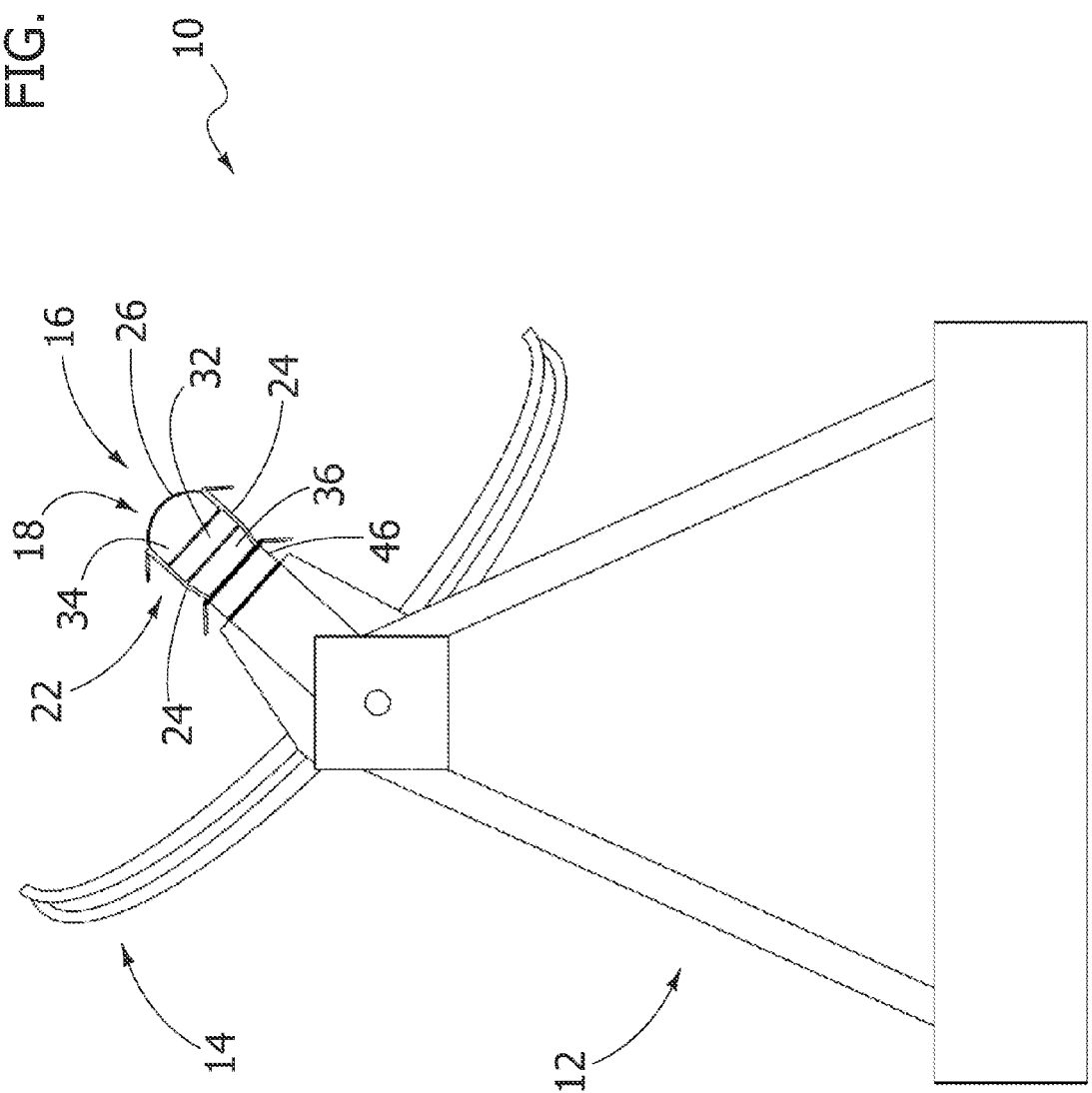
FIG. 2 is a side view of the photovoltaic system of FIG. 1.

With reference to FIGS. 1 and 2, designated by 10 is a concentration photovoltaic system including a supporting structure 12 bearing a reflecting element 14 and a receiver 16. The reflecting element 14 is preferably formed by a mirror with parabolic reflecting surface that concentrates the solar radiation reflected onto the receiver 16.

The receiver 16 according to the present invention has a structure elongated in a longitudinal direction 20, formed by a plurality of modules 18 set alongside one another. The single modules 18 are set alongside and fixed to one another along respective front surfaces 28 (FIG. 3) orthogonal to the direction 20 so as to form a self-bearing structure elongated in the longitudinal direction 20.

Figure 3:
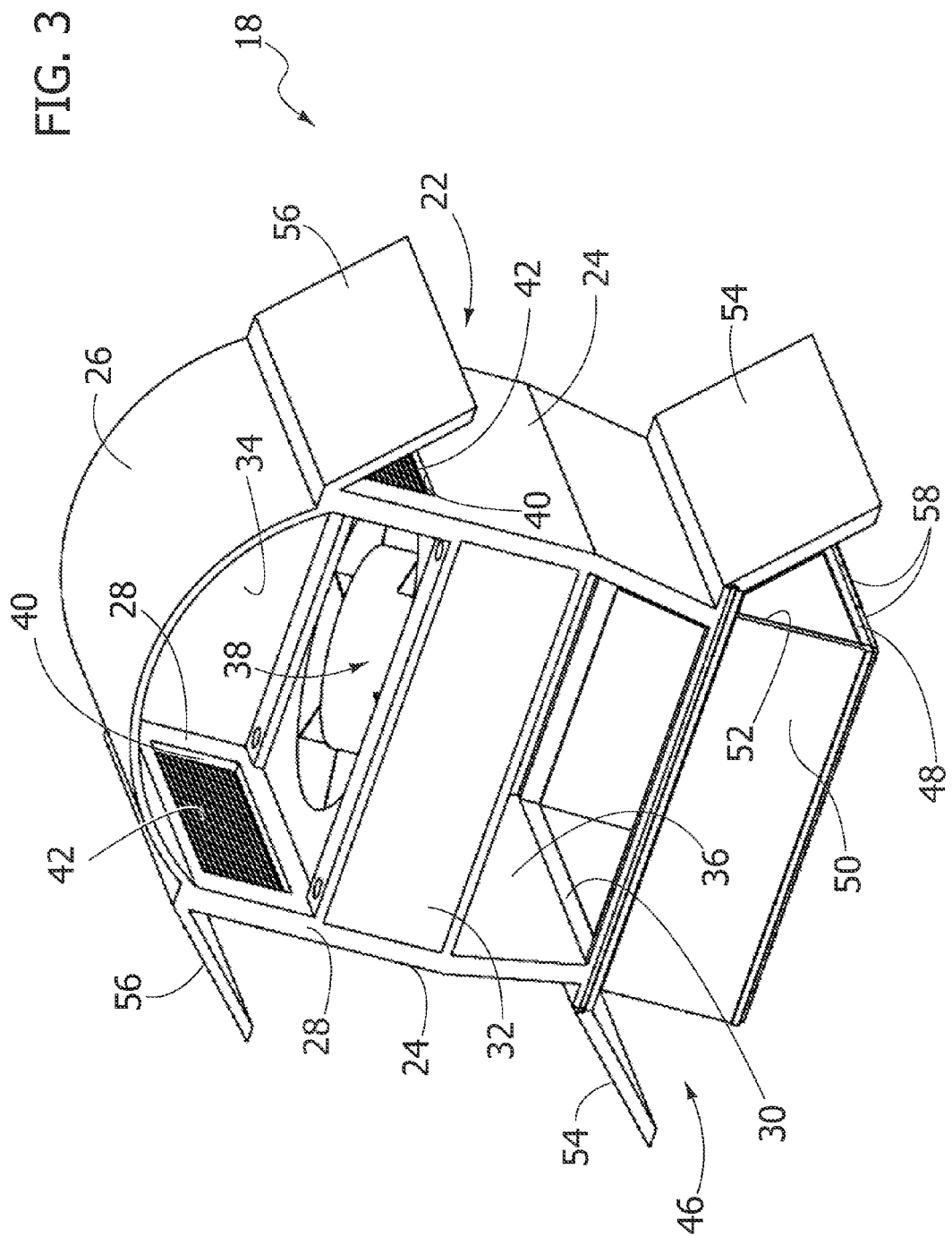
FIG. 3 is a perspective view of a module of the photovoltaic receiver according to the present invention.
Figure 4:
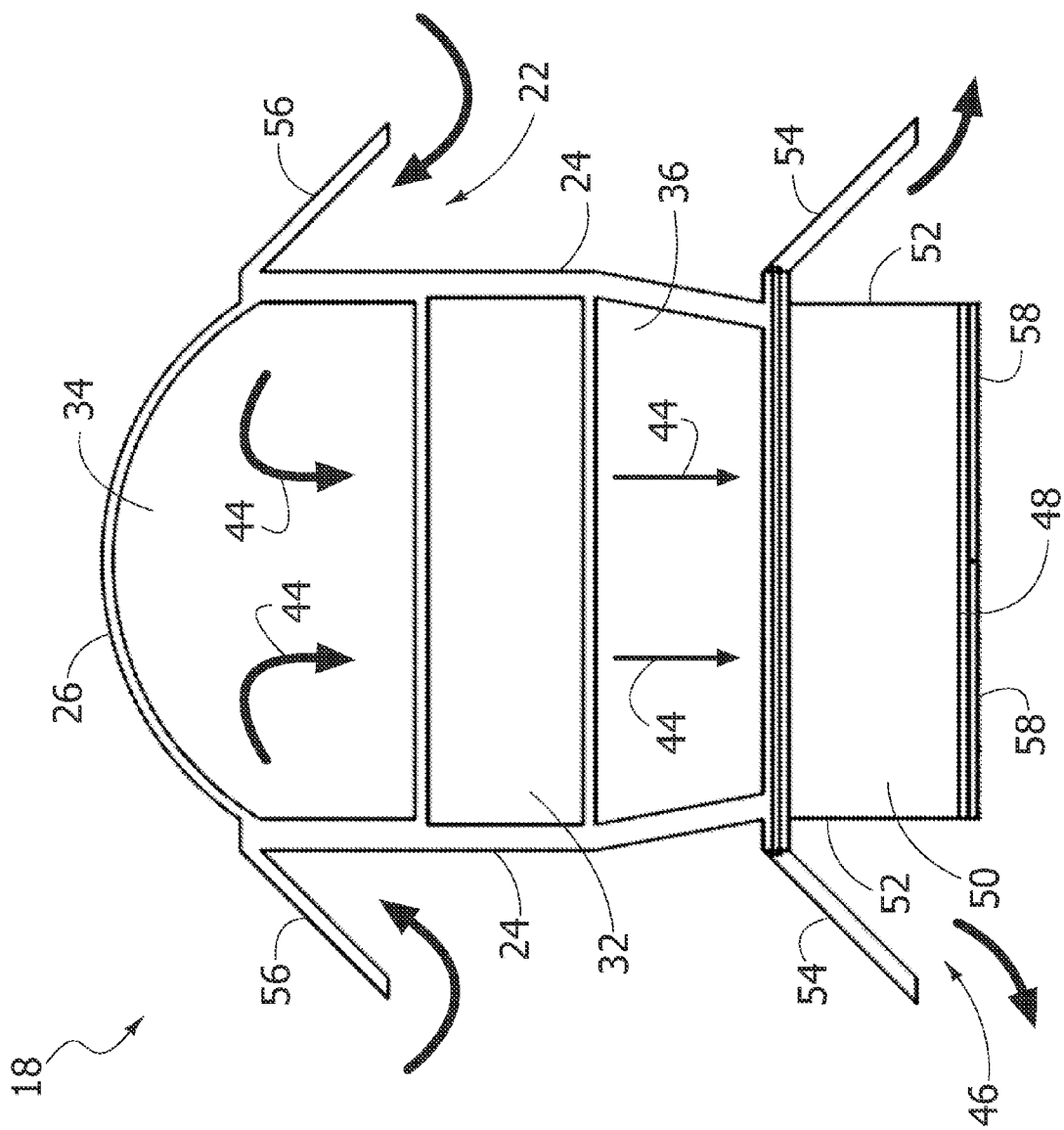
FIG. 4 is a side view of the module of FIG. 3.

With reference to FIGS. 3 and 4, each module 18 comprises a casing 22 having two side walls 24 and a top wall 26, preferably of arched shape. The casings 22 of the individual modules 18 are identical to one another. Each casing 22 is open on its front sides 28 and has an open bottom end 30. Each casing 22 has a central section 32, a top section 34, and a bottom section 36. Housed in the central section 32 is an axial-flow electric fan 38. The top section 34 forms a suction chamber for intake of the flow of air, which communicates with the external environment by means of windows 40 formed in the side walls 24. The windows 40 are preferably equipped with grilles with one-way valves 42. The fan 38 in operation generates a flow of air directed from the top section 34 towards the bottom section 36, or vice versa. In the example illustrated, said flow of air is directed orthogonally to the bottom opening 30 of the casing 22, as indicated by the arrows 44 in FIG. 4. Alternatively, it could be convenient to reverse the directions of suction and delivery of the fan 38 with respect to what is illustrated in FIG. 4. In this case, the flow of cooling air would be sucked into the bottom section and sent towards the top section 34.

The casings 22 of the various modules are fixed to one another along the respective front surfaces 28, for example by means of welding, gluing or the like. The top sections 34 and the bottom sections 36 of the adjacent modules are in direct communication with one another through the respective front openings. In this way, in the case where the fan of a module does not function, the flow of cooling air is supplied by the fans of the adjacent units.

Each module 18 comprises a finned dissipater 46 made of material with high thermal conductivity, such as for example aluminum or the like. The finned dissipator 46 has a base wall 48 and a plurality of fins 50 orthogonal to the base wall 48. The fins 50 are fixed to the bottom end of the casing 22. Each dissipator 46 is open at its side ends so that on each side of the module 18 there are formed two openings 52 for discharge of the flow of air, each opening 52 being delimited by the walls 48 and fins 50 of the dissipator 46 and by the bottom end of the respective side wall 24 of the casing 22. Preferably, each opening 52 is associated to a respective protection fin 54, which extends from the bottom end of the respective side wall 24 of the casing 22. Window protection fins 56, similar to the protection fins 54, can be provided in positions corresponding to the suction windows 40. The protection fins 54 and the window protection fins 56 are inclined with respect to the side walls 24 according to a general roof-like configuration so as to protect the windows 40 and the openings 52 from the entry of rain.

A plurality of photovoltaic cells 58 is fixed on the bottom face of the base wall 48 of the dissipator 46. The photovoltaic cells 58 are connected electrically to one another, preferably in pairs in parallel with respect to one another, and these pairs are then connected in series. With the connection in series between the pairs of cells 58, it is possible to prevent any electrical insulation between the photovoltaic cells 58 and the dissipator 46. The fact of preventing electrical insulation between the cells 58 and the dissipator 46 enables an improvement in the efficiency of thermal dissipation. The photovoltaic cells 58 of each module 18 are connected in series to the cells of the adjacent modules. Alternatively, in certain cases it may be envisaged that the photovoltaic cells 58 of each module 18 are connected in parallel to one another.

In operation, the electric fan 38 generates a flow of cooling air directed towards the finned dissipator 46. The fan 38 takes the air from the top section 34, which communicates with the external environment through the windows 40. The flow of air laps the fins 50 of the dissipator 46 and exits from the openings 52. Alternatively, the flow of air is drawn in from the external environment through the openings 52, laps the fins 50 of the dissipator 46, and is expelled from the windows 40 of the top section 34. The receiver according to the present invention can be equipped with a fan 38 for each module 18. Alternatively, each fan 38 can serve two or more adjacent modules.

The receiver according to the present invention enables an effective cooling of the photovoltaic cells to be obtained, preventing excessively high temperatures (which would lead to a loss of efficiency of the photovoltaic cells) from being reached even in conditions of high concentration of solar radiation. Air cooling with dissipators and fans enables a reduction in the consumption energy of the operation of cooling. The modular structure of the receiver is particularly advantageous from the constructional standpoint and enables convenient adaptation of the dimension in the longitudinal direction of the receiver to the respective reflecting element.

The solution according to the present invention enables use of a small amount of energy for cooling the photovoltaic cells. The flows of cooling air have short paths and extend through a very permeable structure. Consequently, a modest amount of energy is sufficient to move large amounts of air.

The cooling structure is very compact and has overall dimensions in plan view equal to the size of the photovoltaic cells. In this way, the effect of obscuration of the lenses due to the shadow projected on the mirrors by the cooling structure is minimized.

While the foregoing is directed to embodiments of the present invention, other and further embodiments of the invention may be devised without departing from the basic scope thereof, and the scope thereof is determined by the claims that follow.

The invention claimed is:

1. A photovoltaic receiver, comprising:
   an elongated structure comprising a plurality of modules, each module including:
      a casing, the casing including a central section, a top section, and a bottom section having an open bottom end, and
      a front surface having an opening, the front surface being orthogonal to a longitudinal direction of said elongated structure, each module being fixed to one another along said front surfaces;
   an axial-flow fan set in the central section of the casing of at least one module;
   a plurality of finned dissipators that are carried by the elongated structure, each dissipator fixed to a bottom end of one of the modules and in flow communication with the bottom section of the casing of the one of the modules, each dissipator including a bottom wall with a bottom face and a plurality of fins;
   a plurality of photovoltaic cells mounted on the bottom faces of the finned dissipators; and
   a ventilating means designed to convey a flow of cooling air towards said finned dissipators.

2. The receiver according to claim 1, wherein the top section and the bottom section of each module are in direct communication with the corresponding sections of adjacent modules.

3. The receiver according to claim 1, wherein the photovoltaic cells are connected in pairs in parallel to one another and are carried by the dissipators without the interposition of insulating material.

4. The receiver according to claim 1, wherein a reflecting element concentrates solar radiation onto the receiver.

5. The receiver according to claim 4, wherein the reflecting element concentrates solar radiation onto the photovoltaic cells.

6. The receiver according to claim 1, wherein each casing further comprises two side walls connected together by a top wall.

7. The receiver according to claim 6, wherein windows are included on the side walls for entry of the flow of cooling air.

8. The receiver according to claim 7, wherein each dissipator includes openings for exit of the flow of cooling air.

9. The receiver according to claim 8, wherein each casing is equipped with protection fins and window protection fins arranged according to a general roof-like configuration and associated with the windows and openings for the entry and exit of the flow of cooling air.

\* \* \* \* \*